(12) United States Patent
Kimoto

(10) Patent No.: US 6,731,123 B2
(45) Date of Patent: May 4, 2004

(54) PROBE DEVICE

(75) Inventor: Gunsei Kimoto, 1-3-2-807, Daiba, Minato-Ku, Tokyo (JP)

(73) Assignee: Gunsei Kimoto, Tokyo (JP)

( * ) Notice: Subject to any disclaimer, the term of this patent is extended or adjusted under 35 U.S.C. 154(b) by 0 days.

(21) Appl. No.: 10/233,957

(22) Filed: Sep. 3, 2002

(65) Prior Publication Data

US 2003/0067315 A1 Apr. 10, 2003

(30) Foreign Application Priority Data

Sep. 3, 2001 (JP) ........................................ 2001-312022

(51) Int. Cl.⁷ ............................................... G01R 31/02
(52) U.S. Cl. ..................... 324/754; 324/765; 324/158.1
(58) Field of Search ................................ 324/754, 765, 324/758, 158.1, 761, 762; 439/912, 70, 68

(56) References Cited

U.S. PATENT DOCUMENTS

| | | | | |
|---|---|---|---|---|
| 4,195,259 A | * | 3/1980 | Reid et al. ................... | 324/754 |
| 4,862,077 A | * | 8/1989 | Horel et al. .................. | 324/754 |
| 5,982,184 A | * | 11/1999 | Hasegawa .................... | 324/754 |
| 6,040,704 A | * | 3/2000 | Kondo et al. ................. | 324/762 |
| 6,271,674 B1 | * | 8/2001 | Hasegawa et al. ........... | 324/754 |
| 6,310,483 B1 | * | 10/2001 | Taura et al. .................. | 324/754 |
| 6,333,635 B1 | * | 12/2001 | Lee et al. ..................... | 324/754 |

* cited by examiner

*Primary Examiner*—Evan Pert
*Assistant Examiner*—Jimmy Nguyen
(74) *Attorney, Agent, or Firm*—Haynes and Boone, LLP.

(57) ABSTRACT

A probe device is provided which solves a problem of connection between vertical probes assembled at a narrow pitch and connection terminals formed on a printed circuit board at a coarse pitch. For this purpose, the probe device comprises: a probe assembly made up of a plurality of regularly arrayed vertical probes; a flexible flat cable having metal lines formed and bonded to a surface of a non-conductive flexible film; and a fixing device for fixing one end of the flexible flat cable; wherein metal line terminals formed at the one end of the flexible flat cable secured to the fixing device are put in contact with the probe assembly, metal line terminals formed at the other end of the flexible flat cable are connected to a printed circuit board, and the semiconductor chip to be inspected and the printed circuit board are electrically connected together through the probe assembly and the flexible flat cable.

13 Claims, 10 Drawing Sheets

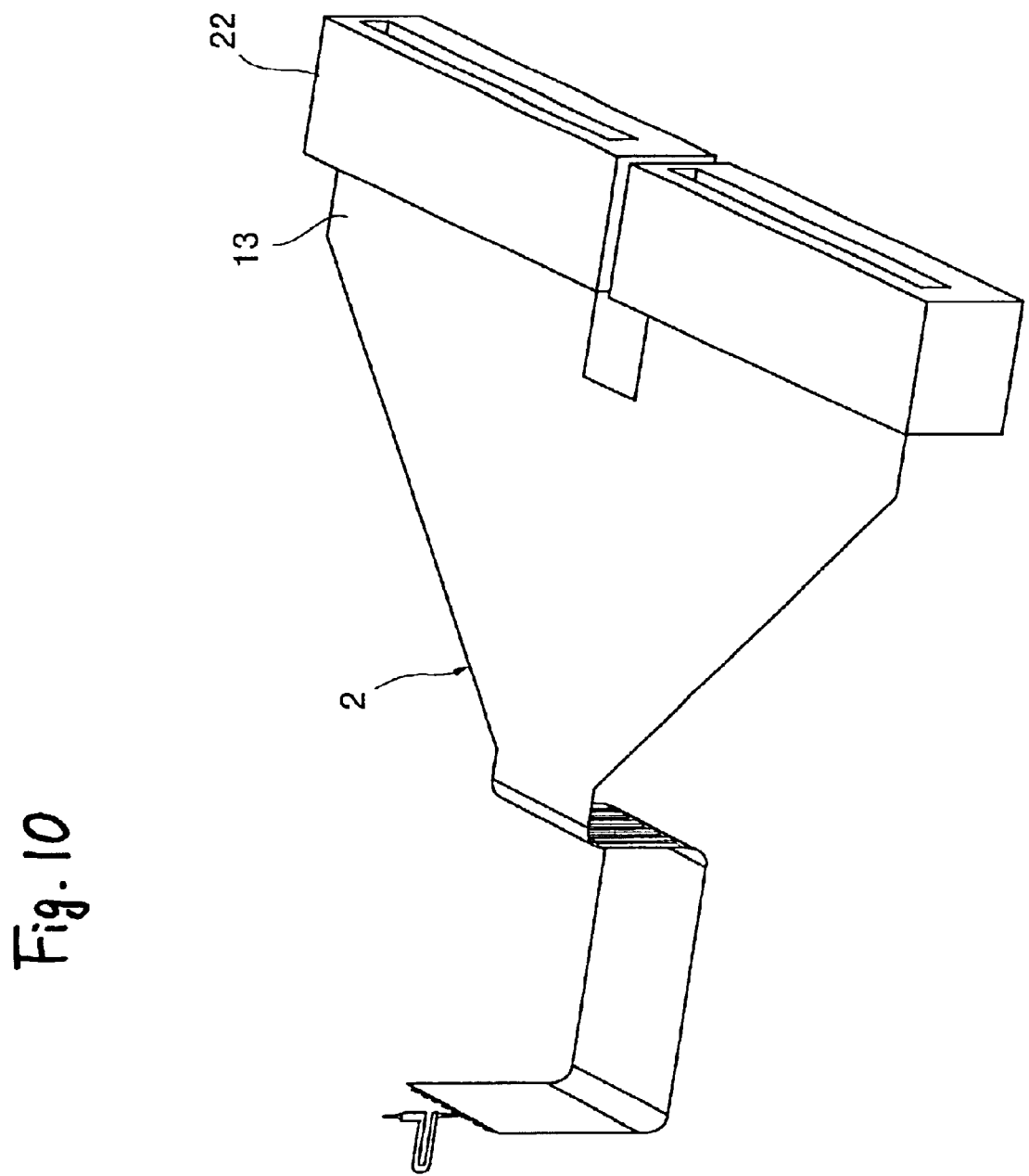

PROBE DEVICE

BACKGROUND OF THE INVENTION

1. Field of the Invention

The present invention relates to a probe device for inspecting circuits of such electronic devices as semiconductor wafers, semiconductor integrated circuit chips and liquid crystal devices whose circuit terminals (pads) are arranged two-dimensionally, and more particularly to a probe device for making electrical connections between two electronic devices or for electrically connecting to a socket of a chip-size package (CSP) whose pads are arrayed two-dimensionally.

2. Description of Prior Art

With the advance of semiconductor manufacturing technologies, a degree of integration of electronic devices improves, resulting in an increase in an area occupied by interconnect wiring in semiconductor chips formed on a semiconductor wafer, which in turn increases the number of pads on each semiconductor chip. This leads to reductions in an area of each pad and in a pad pitch, thus accelerating a miniaturization of pad arrays. At the same time, connection terminal arrays of a socket used to inspect the CSPs are also being miniaturized.

A problem arising from the miniaturization of the pad arrays (reduced pad pitch) is that, in performing electric characteristic tests and circuit inspections on electronic devices, a structure of contacts or probes that are brought into contact with associated pads of a semiconductor chip to achieve electric conduction needs to be reduced in size to match the miniaturization of the semiconductor chip. A variety of means are available that help the probes meet requirements imposed by the miniaturized pad arrays.

For example, there is a means that interposes between pads of a semiconductor chip to be inspected and an inspection apparatus a probe assembly comprising a plurality of two-dimensionally arranged probes which are each made from a thin plate material and elastically deformable when applied an external force (Japanese Patent Disclosure No. 2001-091537). As a means for making an electrical connection between such a probe assembly and a semiconductor chip test circuit, a printed circuit board called a probe card has conventionally been used.

In a probe card of cantilever type that employs needle-shaped contacts or probes, although tip portions of the probes in contact with pads of a semiconductor chip are narrow in pitch, root portions of the probes connected with terminals of the probe card can be made coarse in pitch, so that the probes can be securely connected, as by soldering, to the terminals of the probe card for electric connection.

On the other hand, in a probe card disclosed in Japanese Patent Disclosure No. 1-189932 in which probes are vertically fixed to terminals of a printed circuit board (hereinafter referred to as vertical probes) and thus subject to a vertically acting force, it is required that a pad pitch on a semiconductor chip and a terminal pitch on the printed circuit board or probe card be equal. However, on the printed circuit board it is difficult to micro-fabricate a circuit pattern and thus the area of each terminal and the width of each wire are inevitably wide. Hence, as the level of miniaturization progresses, vertically securing the vertical probes to the printed circuit board while keeping the probe pitch aligned to the pad pitch of the semiconductor chip becomes increasingly difficult.

As described above, in the printed circuit board or probe card a two-dimensional area is occupied by metal wires in addition to probes and terminals, which basically act to hinder the miniaturization of the printed circuit board to match the ever decreasing pad pitch of semiconductor chips. For those chips whose pads are arranged in a lattice formation or in staggered columns, a method is available which employs a multilayer printed circuit board as a means to achieve an electric connection from inside pads to outside circuits. The multilayer structure, however, requires through-holes (vertical holes piercing the wiring board) that make electrical connection between different layers, and a space occupied by the through-holes becomes an obstacle to reducing the pitch of arrayed terminals.

Another connection method, which can deal with the lattice area array type vertical probes, connects the probes and the printed circuit board by soldering wires. However, there is a limit to the reduction in the pitch of the probes and terminals at which they can be soldered with wires, and the number of wires has already reached the limit. As described above, not only are further reductions in the pitch difficult to achieve with these methods but they also require a large number of processing steps, which in turn leads to increased cost.

SUMMARY OF THE INVENTION

According to one aspect, the present invention provides a probe device for making electrical connections between a semiconductor chip to be inspected and an inspection device through probes by bringing the probes into contact with the semiconductor chip, the probe device comprising: a probe assembly made up of a plurality of regularly arrayed vertical probes; a flexible flat cable having metal lines formed and bonded to a surface of a non-conductive flexible film; and a fixing device for fixing one end of the flexible flat cable; wherein metal line terminals formed at the one end of the flexible flat cable secured to the fixing device are put in contact with the probe assembly, metal line terminals formed at the other end of the flexible flat cable are connected to a printed circuit board or a connector, and the semiconductor chip to be inspected and the inspection device are electrically connected together through the probe assembly, the flexible flat cable and the printed circuit board or connector.

According to another aspect of the invention, the regularly arrayed vertical probes vertically contact end faces of the metal line terminals formed at the one end of the flexible flat cable; an arrangement of the metal line terminals formed at the one end of the flexible flat cable corresponds to an arrangement of the regularly arrayed vertical probes; an arrangement of the metal line terminals formed at the one end of the flexible flat cable is a line array; and a plurality of the flexible flat cables each having line-arrayed metal line terminals at the one end thereof are gathered to form an area array of the metal line terminals.

According to still another aspect of the invention, the metal line terminals formed at the one end of the flexible flat cable protrude slightly from one end face of a non-conductive flexible film forming the flexible flat cable; and the flexible flat cable is shaped like a strip having a narrow-width portion at one end and a wide-width portion at the other end, and narrow-pitch metal lines formed in the narrow-width portion and coarse-pitch metal lines formed in the wide-width portion are connected.

According to a further aspect of the invention, the fixing device for fixing the flexible flat cable having the metal line terminals facing line-arrayed vertical probes includes: a fixing block having a plurality of vertical surfaces; a clamper for pressing a narrow-width portion formed at the one end of the flexible flat cable against the vertical surfaces of the fixing block, with end faces of the metal line terminals facing up, to securely hold the flexible flat cable; and a moving mechanism for the clamper. The metal line terminals of the flexible flat cable facing the line-arrayed vertical probes are arrayed in line along an upper side of each of the vertical surfaces of the fixing block, with tips of the metal line terminals slightly protruding from the upper sides of the vertical surfaces.

According to a further aspect of the invention, the fixing device for fixing the flexible flat cables having the metal line terminals facing area-arrayed vertical probes includes: a flat metal line separation and fixing device having a plurality of slits; and a flat metal line positioning and fixing device installed over the flat metal line separation and fixing device and having columns of small holes formed therein at positions facing the slits; wherein narrow-width portions of the flexible flat cables are passed from under the flat metal line separation and fixing device through the slits and then the metal line terminals are passed into the small holes, thereby securely holding the flexible flat cables. The metal line terminals of the flexible flat cables facing area-arrayed vertical probes are arrayed, with their tips slightly protruding from the small holes of the flat metal line positioning and fixing device. The small holes formed in the flat metal line positioning and fixing device are arrayed in a lattice formation or in staggered columns.

According to a further aspect of the invention, the flexible flat cable has one end thereof secured to the fixing device and the other end passing under the fixing device and connected to connection terminals of the printed circuit board or connector. The probe device further includes a probe connection structure constructed of the flexible flat cable and the fixing device securely holding the flexible flat cable, the flexible flat cable having line-arrayed or area-arrayed metal line terminals.

As described above, the probe device of this invention produces the following effects by taking advantage of the functions of the FFC. That is, a probe connection structure that forms a connection point for the vertical probes can be assembled by simply holding one end of each FFC to the fixing device and using the end faces (cut faces) of the narrow-pitch terminals on the FFCs for connection with the probes. Further, by converting the pitch of the metal lines connecting to this connecting point from a narrow pitch at one end of each FFC to a coarse pitch at the other end, a connection can easily be made between the metal lines and a printed circuit board or a connector.

Further, the probe device of this invention can be used for a wide range of applications, which include circuit inspections on semiconductor wafers, semiconductor integrated circuit chips and liquid crystal devices whose circuit terminals (pads) are arranged two-dimensionally at a narrow pitch, electrical connections between two electronic devices by using the connector functions, and also electrical connections to a socket of CSP whose pads are arranged two-dimensionally.

It is therefore a first object of the present invention to provide a probe device which uses vertical probes developed to comply with a reduced pitch of pads on semiconductor chips and which can make correct connections between the vertical probes assembled at a reduced pitch and connection terminals of a printed circuit board or connector formed at a conventional coarse pitch.

A second object of the present invention is to provide a probe device that can facilitate electric characteristic inspections on semiconductor chips with reduced-pitch pads.

A third object of the present invention is to provide a probe device having multiple functions so that it can be used also as a connector for connection with a CSP socket and for connection between two electronic devices.

These and other objects and advantages of the present invention will become more apparent from the following description of embodiments thereof taken in conjunction with the accompanying drawings.

BRIEF DESCRIPTION OF THE DRAWINGS

FIG. 10 is a perspective view showing a connection structure between the FFC and a connector according to a third embodiment.

DESCRIPTION OF THE PREFERRED EMBODIMENTS

First Embodiment

Figure 1:
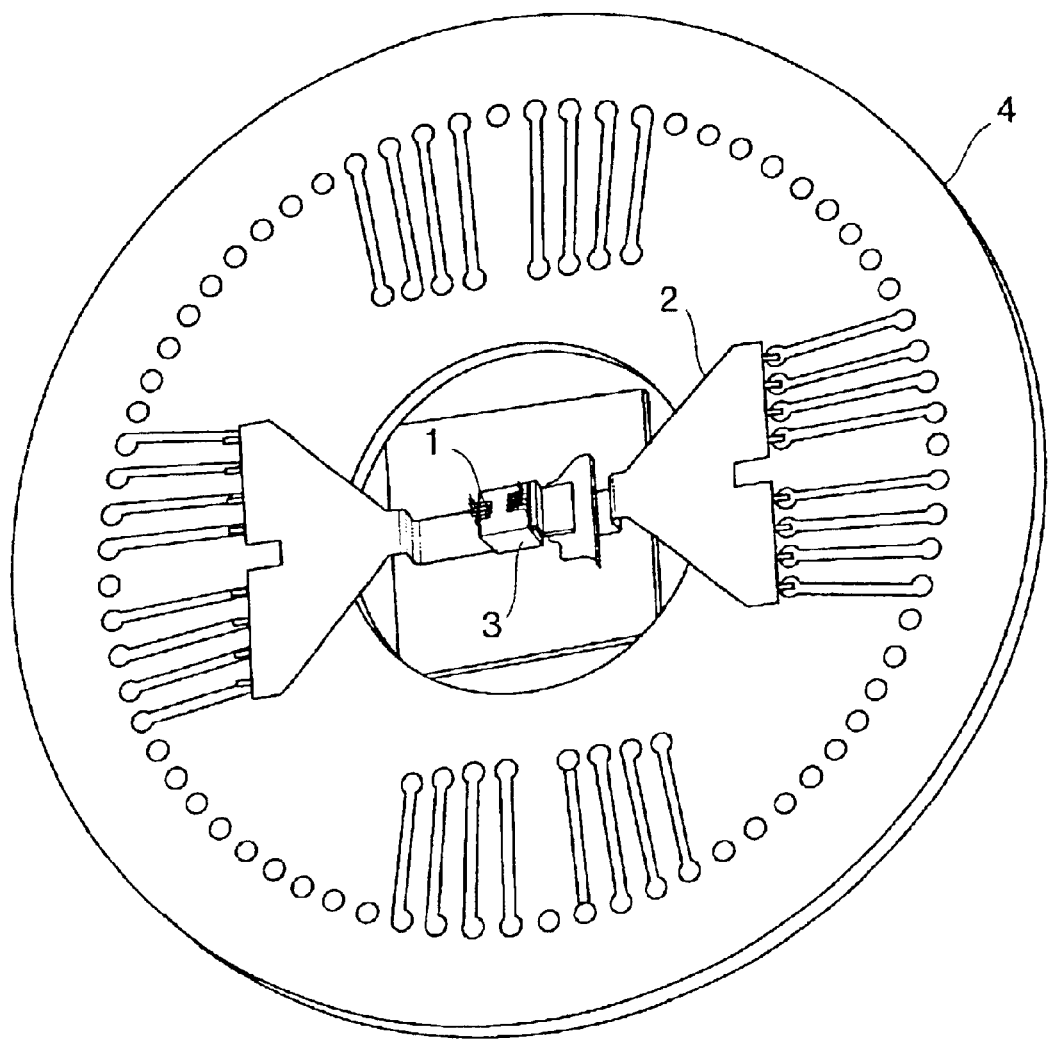
FIG. 1 is a perspective view showing a first embodiment of the present invention.
Figure 2:
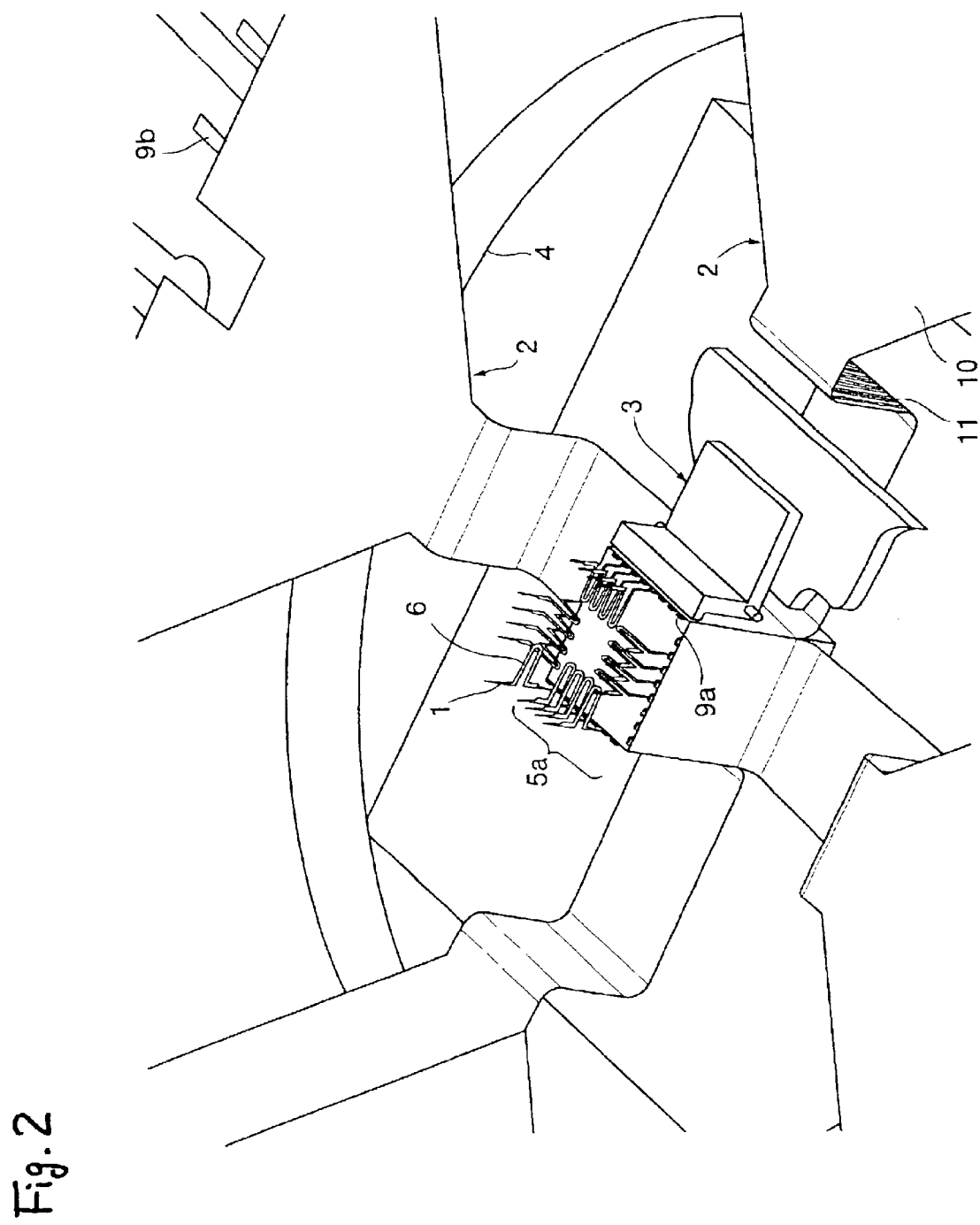
FIG. 2 is an enlarged view of a central portion of FIG. 1.

FIG. 1 is a perspective view showing an outline construction of a probe device according to a first embodiment of the present invention. FIG. 2 is an enlarged detailed view of a central portion of FIG. 1.

The probe device shown in FIG. 1 and FIG. 2 includes the following components: vertical probes 1 each made from a conductive material and having a curved portion 6 in the middle; a probe assembly 5a of line array type having a plurality of vertical probes 1; flexible flat cables (abbreviated FFCs) 2 each having a wiring pattern of copper foil formed on a non-conductive flexible film; fixing devices 3 for fixing one end of each FFC; and a printed circuit board 4 to which the other end of each FFC is connected. The FFC and the fixing device are actually arranged in four directions but a part of them is not shown. More detailed explanations on the constitutional components will be given by referring to the accompanying drawings.

Figure 3:
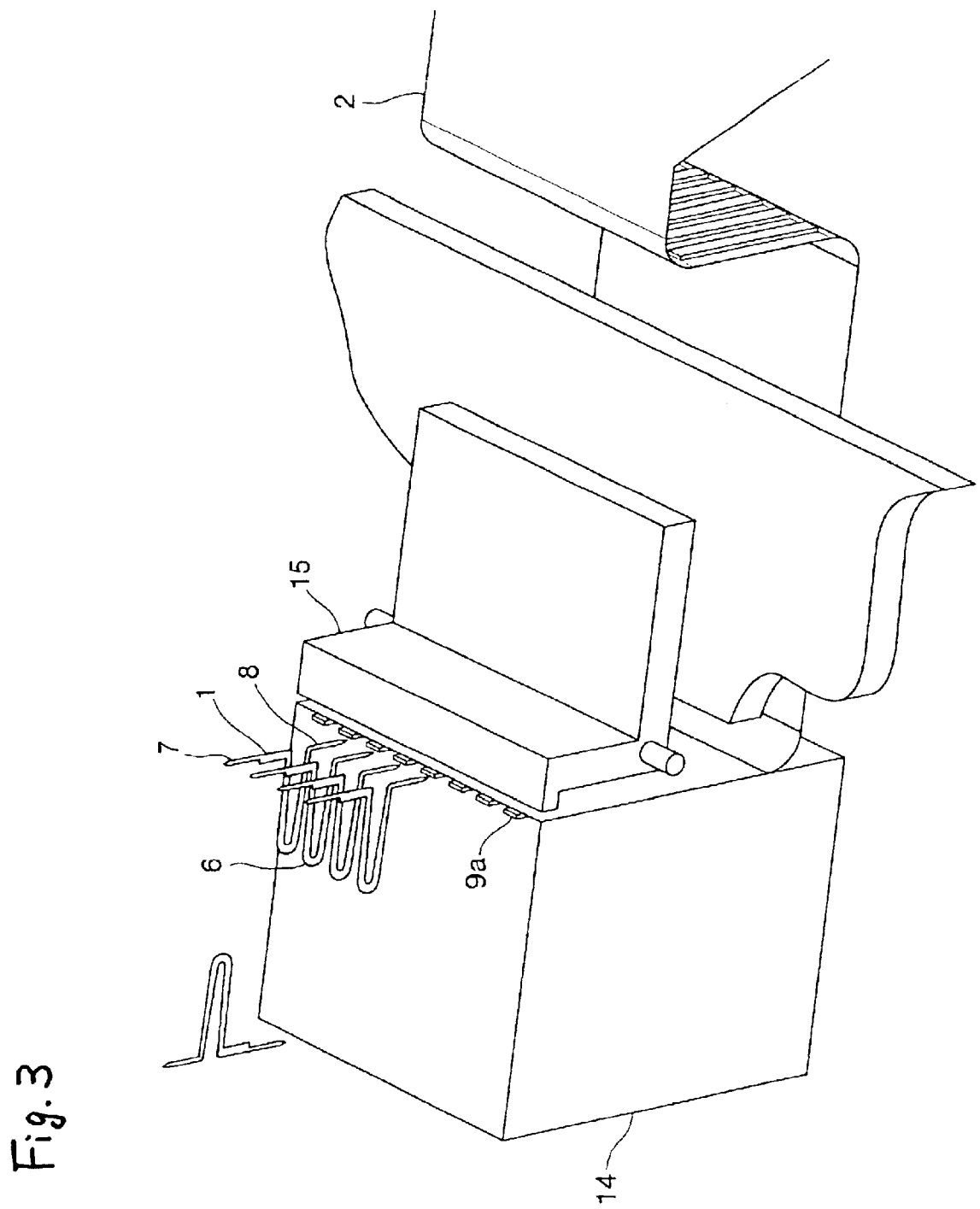
FIG. 3 is a perspective view showing a construction of a line array type probe assembly used in the first embodiment.

FIG. 3 is an enlarged view showing a construction and an arrangement of the vertical probes used in this embodiment. As shown in FIG. 3, a plurality of vertical probes 1 are formed from a plate- or needle-like conductive material, such as beryllium copper, with a high mechanical strength and have a U-shaped curved portion 6 in the middle of each probe to produce an elasticity so that the curved portion can absorb an external force acting in the vertical direction. The vertical probe other than the curved portion 6 is formed vertical and its upper end 7 and lower end 8 are pointed.

These multiple vertical probes 1 are securely held to a support board not shown to form a probe assembly 5a. The probe assembly 5a can be moved in X, Y and Z directions of an XYZ orthogonal coordinate system and also in a θ direction by a moving mechanism (not shown) for positioning.

The vertical probes 1 have their upper ends 7 formed for contact with the pads of a semiconductor chip (not shown) and are arrayed and assembled to match the pad array and pitch of the semiconductor chip. Here, an example case is described in which a semiconductor wafer formed with semiconductor chips is held as by a suction means and placed pad side down over the vertical probes 1. It is of course possible to use them upside down. Further, while the description here concerns the probe assembly 5a for use with semiconductor chips whose pads are arranged in a straight line (line array type), a probe assembly for use with semiconductor chips whose pads are arranged in a plurality of columns (area array type) will be explained in a second embodiment later.

The lower ends 8 of the vertical probes 1 are arranged to come into contact with end faces (cut faces) of metal line terminals protruding from an end face of one end portion of the FFC 2 to achieve an electric conduction between the vertical probes 1 and the FFC 2. The construction of such an FFC 2 will be explained as follows.

Figure 4:
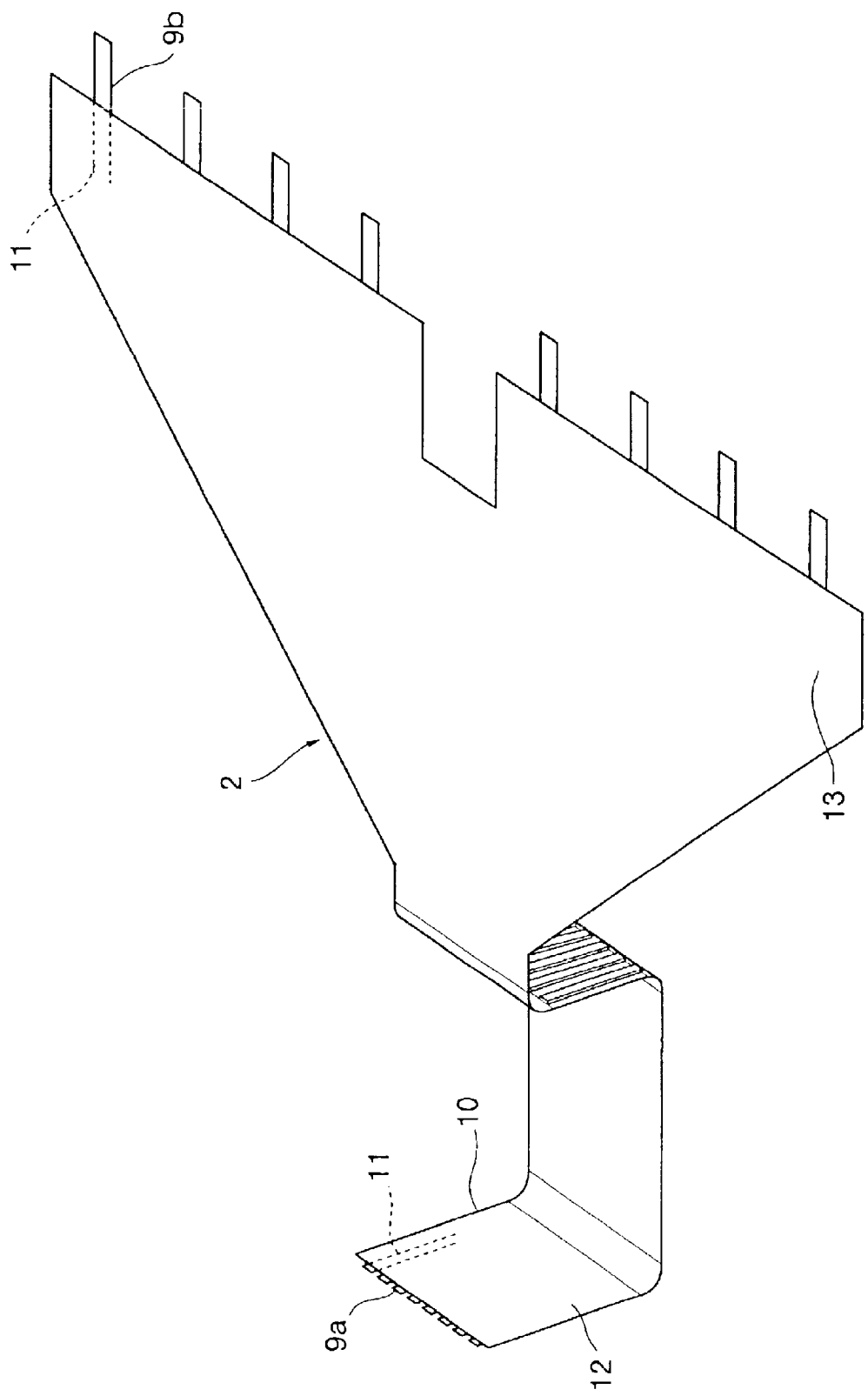
FIG. 4 is a perspective view showing a construction of a flexible flat cable (FFC) used in the present invention.

FIG. 4 is a perspective view showing a construction of a flexible flat cable (FFC) used in this invention. As shown in FIG. 4, the FFC 2 is formed by bonding a foil of beryllium copper to one side of a non-conductive flexible film 10, such as a polyimide film, and etching the foil to form desired metal lines 11 on the flexible film. The FFC 2 is a strip that has a narrow-width portion 12 at one end and a wide-width portion 13 at the other end. In the narrow-width portion 12 facing the vertical probes 1 the metal lines 11 are formed at the same narrow pitch as that of the vertical probes 1. Front ends of the metal lines 11 that form metal line terminals 9a project slightly from the end of the flexible film 10 to ensure reliable electric conduction between the vertical probes 1 and the terminals 9a. In the wide-width portion 13 at the other end of the flexible film 10, the metal lines 11 are arrayed at a coarse pitch, with their ends protruding greatly from the end of the wide-width portion 13 to form metal line terminals 9b for connection with a printed circuit board or a connector. The projecting terminals 9b are shown divided into two groups in FIG. 4 but are not limited to this particular configuration. Further, it is also possible to bond a copper foil to both sides of the flexible film 10, as required, to form the metal lines 11 on both sides.

Among important functions of the FFC 2 are an ability to form the narrow-pitch metal lines with ease, an ability to change the line pitch from the narrow pitch to the coarse pitch, an ability to freely change the direction of the metal lines, and simplified manufacturing, improved handling and enhanced overall strength of the metal lines realized by the integral forming of the flexible film such as a polyimide film and the metal lines.

Figure 5:
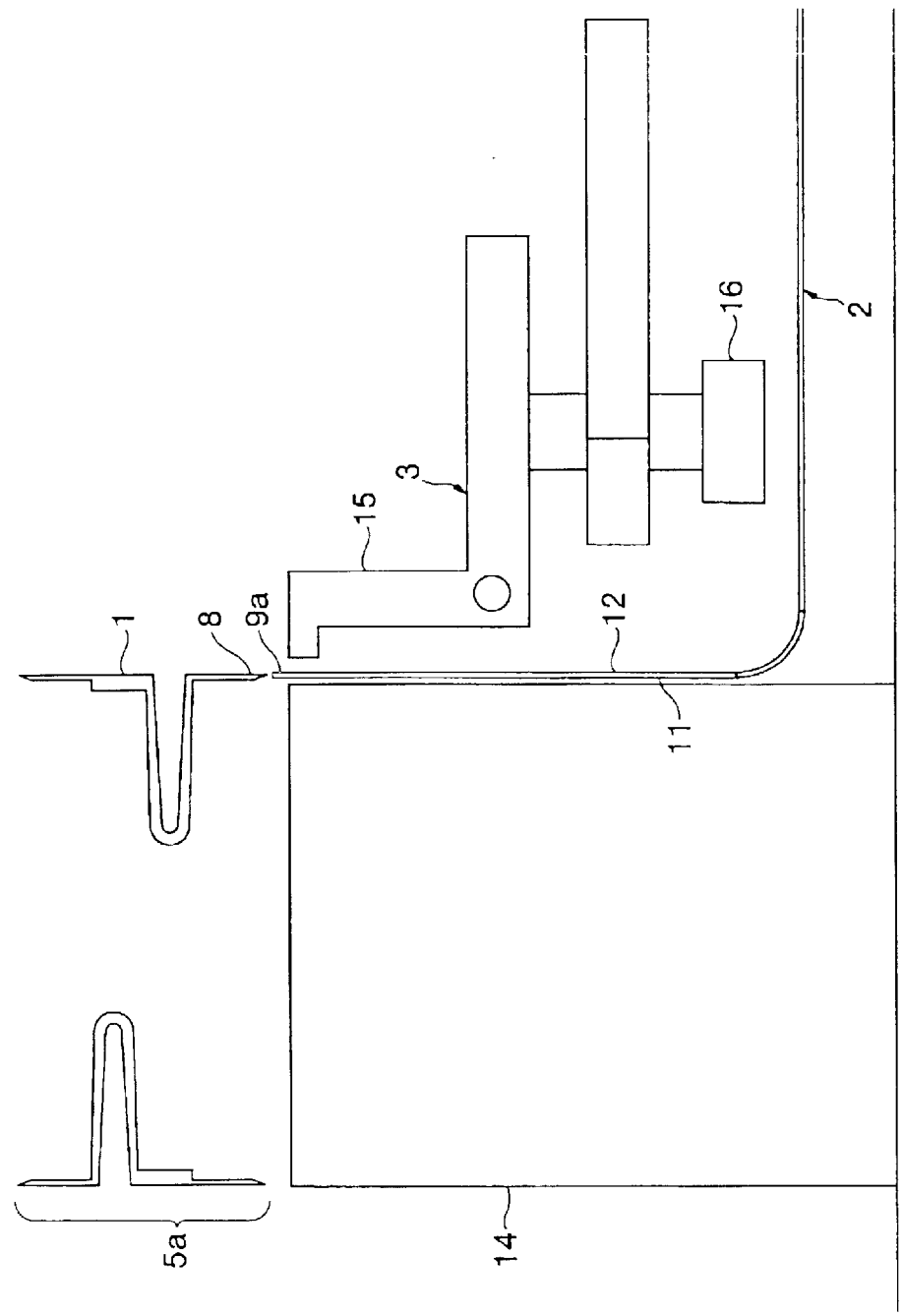
FIG. 5 is a side view of an FFC fixing device according to the first embodiment of the invention.

FIG. 5 is a side view of the fixing device showing a method of fixing the FFC and a method of connecting the FFC with the vertical probes according to the present invention. As shown in FIG. 5, the fixing device 3 includes a fixing block 14, a clamper 15 for pressing the FFC 2 against the fixing block 14 and clamping it, and a screw 16 for opening and closing the clamper 15. The fixing device 3 is made from a non-conductive material.

First, the narrow-width portion 12 at one end of the FFC 2, with the side formed with the metal lines 11 directed toward the fixing block 14, is placed in contact with the fixing block 14. The clamper 15 is pivoted by the screw 16 to press the FFC 2 against the fixing block 14 and fix it. At this time, the FFC 2 is positioned as follows. The end face of the flexible film is aligned with a top surface of the fixing block 14 so that the metal line terminals 9a arrayed along each side of the top surface protrudes slightly above the top surface of the fixing block 14. The similar positioning process is performed in four directions, or at four sides, of the fixing block 14 to secure the FFC 2 (FIG. 5 illustrates the positioning and fixing process in only one direction). With this process done, the metal line terminals 9a with the same pitch as that of the line-arrayed pads arranged along the four sides of a semiconductor chip are formed along the four sides of the fixing block 14. The FFC 2 and the fixing device 3 combine to form a probe connection structure.

Next, a probe assembly 5a in which the vertical probes 1 are assembled at the same pitch as the pad pitch of the semiconductor chip is aligned with the metal line terminals 9a, and the lower ends 8 of the vertical probes 1 are brought into elastic contact with the terminals 9a. With the narrow-width portion 12 at one end held to the fixing device 3, the FFC 2 because of its ability to be freely deformed is passed under the clamper 15 and its other end reaches the printed circuit board 4 as shown in FIG. 1. The metal line terminals 9b arranged at a coarse pitch on the wide-width portion 13 shown in FIG. 4 are connected to the printed circuit board 4 by soldering or thermocompression bonding.

Second Embodiment

Next, a second embodiment of the present invention will be described in detail by referring to the accompanying drawings. In the first embodiment we have described a probe device having a probe assembly that can connect to the line-arrayed narrow pitch pads on a semiconductor chip. In the second embodiment, we will describe a probe device having a probe assembly to be used on a semiconductor chip whose pads are area-arrayed (plane- or two-dimensionally arrayed).

Figure 6:
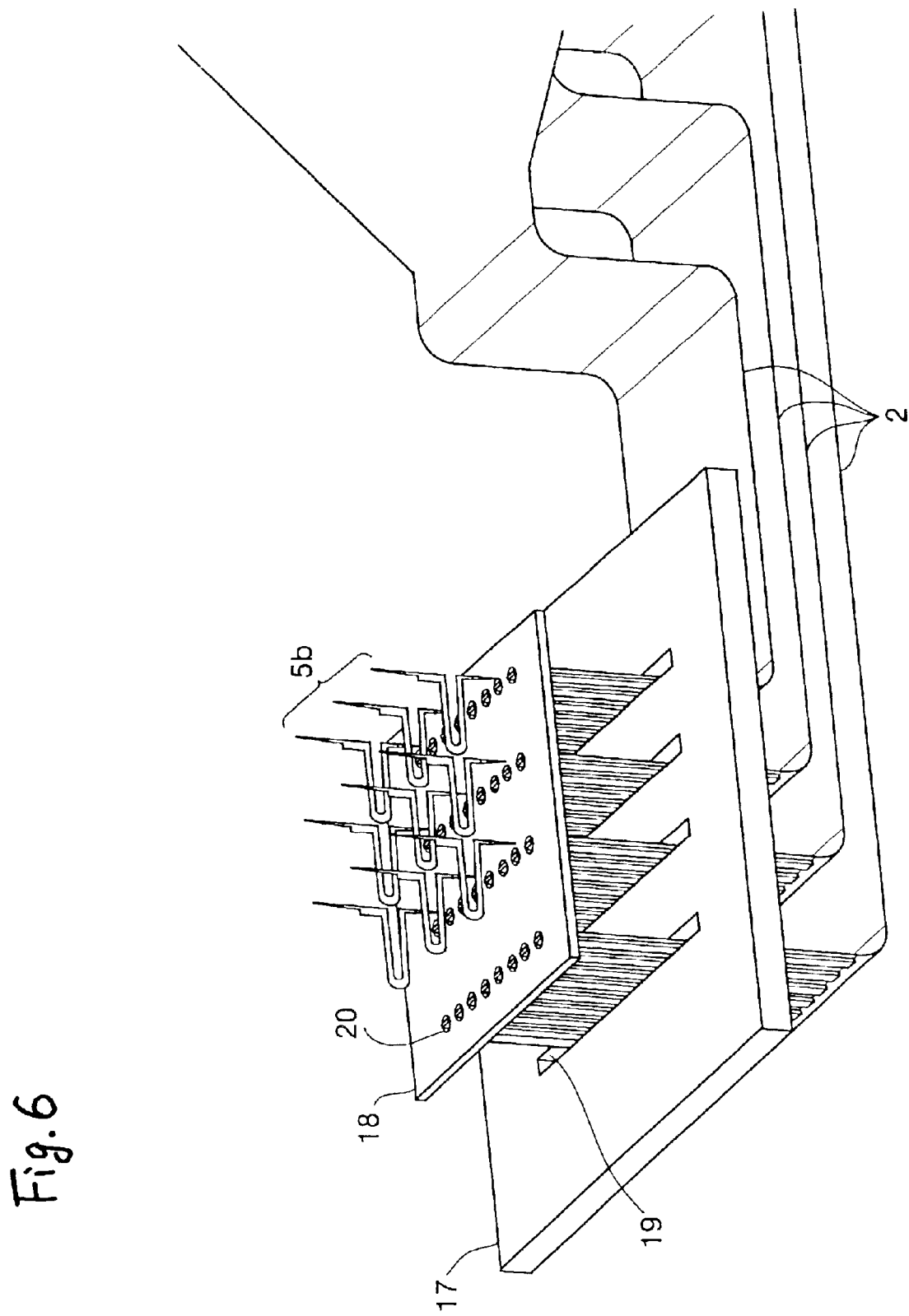
FIG. 6 is a perspective view showing an FFC fixing device according to a second embodiment of the invention.
Figure 7:
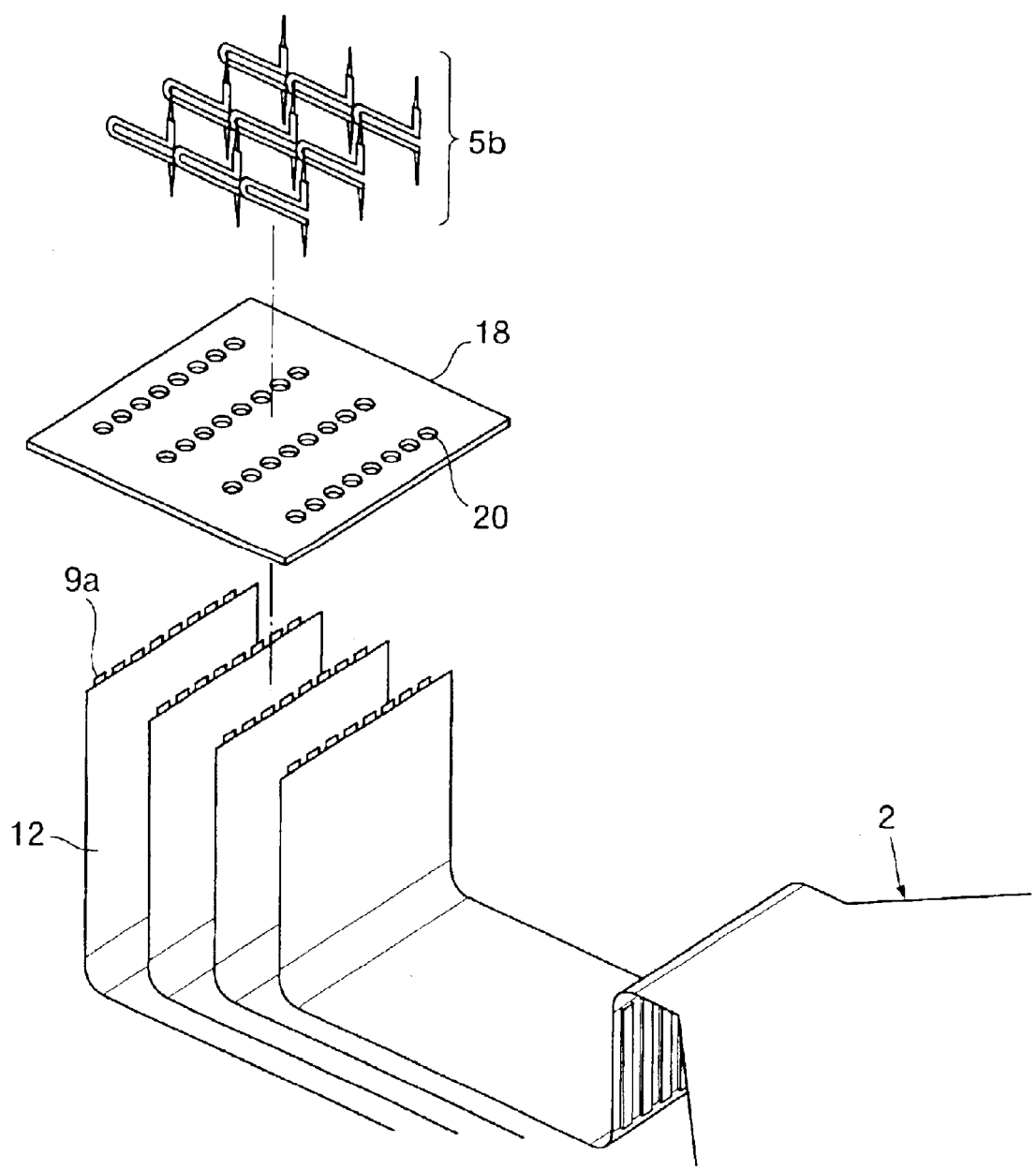
FIG. 7 is an exploded perspective view of FIG. 6.

FIG. 6 is a perspective view showing a fixing device according to the second embodiment of the present invention. FIG. 7 is an exploded perspective view of the same. In this embodiment, the probe device has a probe assembly for inspecting a semiconductor chip whose pads are area-arrayed in a lattice formation. FIG. 6 and FIG. 7 show a probe assembly for use with semiconductor chip pads that are arranged in four columns and eight rows. The area array type probe assembly 5b has 32 vertical probes 1 arranged at a pitch equal to the pad pitch. The structure of the probe assembly 5b and its moving means are equal to those of the line array type probe assembly 5a shown in the first embodiment. Thus, their explanations are omitted here. Although the shape and material of the vertical probes 1 are the same, since they are put closer together, their vertical positions and directions must be changed, as required, to avoid the curved portions touching each other. The FFC 2 also has the same shape and material but a fixing means and its arrangement differ from those of the first embodiment.

The FFC 2 is fixed by a flat metal line separation and fixing device 17 and a flat metal line positioning and fixing device 18. These fixing devices 17 and 18 are both made from a non-conductive material. The flat metal line separation and fixing device 17 is formed with four slits 19 at positions corresponding to those of the pad arrays of a semiconductor chip, with the width and length of each slit 19 so sized that the narrow-width portion 12 of the FFC 2 can just fit into the slit. The flat metal line positioning and fixing device 18 is formed with 32 small holes 20 arranged in four columns and eight rows. The small holes 20 are so sized that the metal line terminals 9a slightly projecting from the end face of the narrow-width portion 12 of the FFC 2 can just fit into the small holes. The flat metal line separation and fixing device 17 and the flat metal line positioning and fixing device 18 are mounted on a support member not shown with the slit positions and the small hole column positions aligned. The small holes 20 may be arranged in a lattice formation or in staggered columns, if necessary.

Now, a method of securing the FFC 2 to the fixing device of the above construction will be explained. Four FFCs 2 are prepared and the narrow-width portions 12 at one end of each FFC 2 are passed from under the flat metal line separation and fixing device 17 into the slits 19. Then, the meta line terminals 9a of the narrow-width portions 12 are inserted into the small holes 20 of the flat metal line positioning and fixing device 18 provided over the flat metal line separation and fixing device 17 and are positioned so that the front ends of the terminals 9a protrude slightly from the top surface of the flat metal line positioning and fixing device 18. In this state, the slits 19 are filled with an adhesive to fix the FFCs 2 and thereby assemble the probe connection structure. While this embodiment uses both the flat metal line separation and fixing device 17 and the flat metal line positioning and fixing device 18, only one of these fixing devices may be used as necessary. FIG. 7 shows a case in which only the flat metal line positioning and fixing device 18 is employed.

Figure 8:
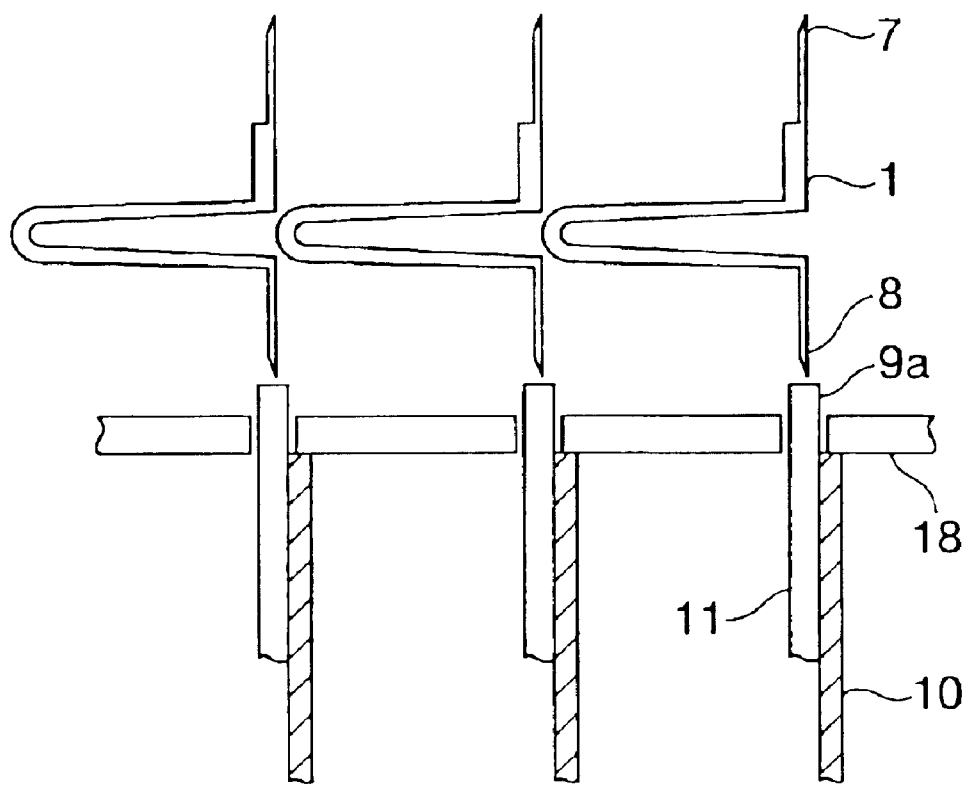
FIG. 8 is an enlarged cross-sectional view showing a construction of an area array type probe assembly used in the second embodiment.

The probe assembly 5b is positioned in this way and put in contact with the terminals 9a arranged two-dimensionally in a lattice formation or in staggered columns. FIG. 8 is a partly enlarged cross-sectional view showing the lower ends 8 of the vertical probes 1 about to come into contact with the end faces (cut faces) of the terminals 9a to make electrical connection. Because the front ends of the terminals 9a protrude slightly above the top surface of the flat metal line positioning and fixing device 18, good electrical connections can be made between the terminals 9a and the vertical probes 1.

Figure 9:
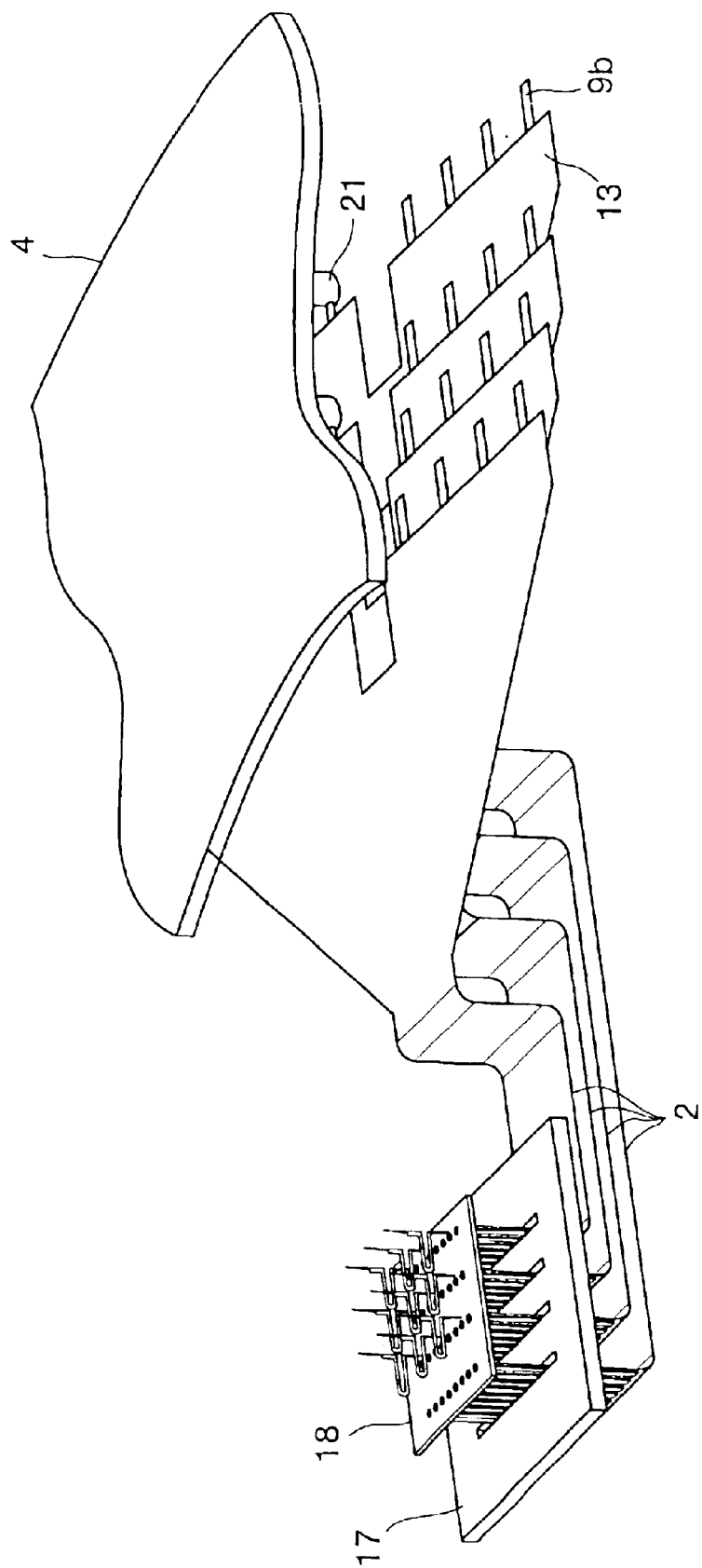
FIG. 9 is a perspective view of a connection structure between the FFC and a printed circuit board according to the second embodiment.

The state in which the other end of the FFC 2 is connected to a printed circuit board will be explained by referring to an enlarged perspective view of FIG. 9. The four FFCs 2, with their narrow-width portions at one end secured to the flat metal line separation and fixing device 17, pass under the fixing device 17 and extend toward the printed circuit board 4. The wide-width portions 13 at the other end of the FFCs 4 overlap each other in a staggered manner so that the coarse-pitch terminals 9b exposed from the ends of the wide-width portions 13 are arranged in four columns and eight rows. The coarse-pitch terminals 9b may be arranged in the form of a lattice or, for ease of soldering operation, in staggered columns. FIG. 9 illustrates the terminals 9b arrayed in staggered columns. Overlapping the FFCs 2 does not pose any electrical problem because the flexible films and the metal lines are stacked alternately.

The printed circuit board 4 to be connected with the coarse-pitch terminals 9b of the FFCs 2 is formed with connection terminals 21 on its underside which are arranged at the same pitch as that of the terminals 9b to which they are to be connected. The columns of terminals 9b exposed from the end faces of the stacked wide-width portions 13 are arranged in steps, their height differences being equal to the thickness of the flexible film. To eliminate their height differences, the terminals 9b are curved up to facilitate an electrical connection with the connection terminals 21 of the printed circuit board 4.

The coarse-pitch terminals 9b of the FFCs and the connection terminals 21 of the printed circuit board are aligned and connected together as by soldering or thermocompression bonding. With the above arrangement, a probe device using an area array type probe assembly, too, can easily make an electrical connection with the printed circuit board.

Next, a third embodiment of the present invention will be described by referring to FIG. 10. In the first and second embodiments, signals from a tested semiconductor chip have been described to be electrically connected to a test device through the probes, FFCs and printed circuit board. In this embodiment the printed circuit board is replaced with a connector, and signals from the tested semiconductor chip are electrically connected to the test device through the probes, FFCs and connectors.

Third Embodiment

FIG. 10 is a perspective view showing an FFC attached with a connector according to a third embodiment of the present invention. As to the construction and the fixing method of the FFC 2, they have already been detailed with reference to FIG. 4 and thus are omitted here. A connector 22 may be a commonly used connector as long as it can be soldered to the coarse-pitch terminals 9b formed in the wide-width portion 13 of the FFC 2. Although in FIG. 10 two female connectors 22 are parallelly arranged, the number of connectors is not limited to two. When the FFCs are arranged in four directions, as shown in FIG. 2, the FFCs may each be attached with a connector or, by taking advantage of the flexibility of the FFCs, bundled together for connection with a single connector. In either case, the use of the connector(s) between the tested object and the testing device can significantly improve the degree of freedom for putting together or branching the wires. As a result, two electronic devices with narrow-pitch pads can also be connected together through a connector.

As described above, the probe device of this invention can produce the following effects by taking advantage of the functions of the FFCs. That is, a probe connection structure that forms a connection point for the vertical probes can be assembled by simply holding one end of each FFC to the fixing device and using the end faces (cut faces) of the narrow-pitch terminals on the FFCs for connection with the probes.

Further, by converting the pitch of the metal lines connecting to this connecting point from a narrow pitch at one end of each FFC to a coarse pitch at the other end, a connection can easily be made between the metal lines and a printed circuit board or a connector.

The present invention has been described in connection with preferred embodiments shown in the accompanying drawings, and it is apparent from the foregoing to those skilled in the art that changes and modifications may be made without departing from the spirit of the invention. It is understood, therefore, that the present invention includes all such changes and modifications.

What is claimed is:

1. A probe device for making electrical connections between a semiconductor chip to be inspected and an inspection device through probes by bringing the probes into contact with the semiconductor chip, the probe device comprising:
   a plurality of vertical probes;
   a flexible flat cable having metal lines formed and bonded to a surface of a non-conductive flexible film; and
   a fixing device for fixing one end of the flexible flat cable;
   a plurality of metal line terminals formed at the one end of the flexible flat cable and having end faces in elastic contact with the vertical probes,
   a plurality of metal line terminals formed at the other end of the flexible flat cable and connected to a printed circuit board or a connector, and the semiconductor chip to be inspected and the inspection device being electrically connected together through the probe assembly, the flexible flat cable and the printed circuit board or connector.

2. A probe device according to claim 1, wherein an arrangement of the metal line terminals formed at the one end of the flexible flat cable corresponds to an arrangement of the regularly arrayed vertical probes.

3. A probe device according to claim 1, wherein an arrangement of the metal line terminals formed at the one end of the flexible flat cable is a line array.

4. A probe device according to claim 1, wherein a plurality of the flexible flat cables each having line-arrayed metal line terminals at the one end thereof are gathered to form an area array of the metal line terminals.

5. A probe device according to claim 1, wherein the metal line terminals formed at the one end of the flexible flat cable protrude slightly from one end face of a non-conductive flexible film forming the flexible flat cable.

6. A probe device according to claim 1, wherein the flexible flat cable is shaped like a strip having a narrow-width portion at one end and a wide-width portion at the other end, and narrow-pitch metal lines formed in the narrow-width portion and coarse-pitch metal lines formed in the wide-width portion are connected.

7. A probe device according to claim 1, wherein the fixing device for fixing the flexible flat cable having the metal line terminals facing line-arrayed vertical probes includes: a fixing block having a plurality of vertical surfaces; a clamper for pressing a narrow-width portion formed at the one end of the flexible flat cable against the vertical surfaces of the fixing block, with end faces of the metal line terminals facing up, to securely hold the flexible flat cable; and a moving mechanism for the clamper.

8. A probe device according to claim 7, wherein the metal line terminals of the flexible flat cable facing the line-arrayed vertical probes are arrayed in line along an upper side of each of the vertical surfaces of the fixing block, with tips of the metal line terminals slightly protruding from the upper sides of the vertical surfaces.

9. A probe device according to claim 1, wherein the fixing device for fixing the flexible flat cables having the metal line terminals facing area-arrayed vertical probes includes: a flat metal line separation and fixing device having a plurality of slits; and a flat metal line positioning and fixing device installed over the flat metal line separation and fixing device and having columns of small holes formed therein at positions facing the slits; wherein narrow-width portions of the flexible flat cables are passed from under the flat metal line separation and fixing device through the slits and then the metal line terminals are passed into the small holes, thereby securely holding the flexible flat cables.

10. A probe device according to claim 9, wherein the metal line terminals of the flexible flat cables facing area-arrayed vertical probes are arrayed, with their tips slightly protruding from the small holes of the flat metal line positioning and fixing device.

11. A probe device according to claim 9, wherein the small holes formed in the flat metal line positioning and fixing device are arrayed in a lattice formation or in staggered columns.

12. A probe device according to claim 1, wherein the flexible flat cable has one end thereof secured to the fixing device and the other end passing under the fixing device and connected to connection terminals of the printed circuit board or connector.

13. A probe device according to claim 1, further comprising a probe connection structure constructed of the flexible flat cable and the fixing device securely holding the flexible flat cable, the flexible flat cable having line-arrayed or area-arrayed metal line terminals.

* * * * *